United States Patent
Balboni

(10) Patent No.: US 7,928,794 B2
(45) Date of Patent: Apr. 19, 2011

(54) METHOD AND APPARATUS FOR A DYNAMICALLY SELF-BOOTSTRAPPED SWITCH

(75) Inventor: Edmund J. Balboni, Littleton, MA (US)

(73) Assignee: Analog Devices, Inc., Norwood, MA (US)

( * ) Notice: Subject to any disclaimer, the term of this patent is extended or adjusted under 35 U.S.C. 154(b) by 220 days.

(21) Appl. No.: 12/176,769

(22) Filed: Jul. 21, 2008

(65) Prior Publication Data
US 2010/0013541 A1 Jan. 21, 2010

(51) Int. Cl.
*H03K 17/687* (2006.01)

(52) U.S. Cl. ........ 327/427; 327/389; 327/419; 327/434; 327/436; 327/534; 327/537

(58) Field of Classification Search .......... 327/389, 327/390, 419, 427–436, 534, 537
See application file for complete search history.

(56) References Cited

U.S. PATENT DOCUMENTS

| | | | |
|---|---|---|---|
| 4,786,879 A | 11/1988 | Dolby | |
| 5,084,634 A | 1/1992 | Gorecki | |
| 5,172,019 A | 12/1992 | Naylor et al. | |
| 5,838,031 A | 11/1998 | Kobayashi et al. | |
| 5,844,434 A | 12/1998 | Eschauzier | |
| 6,060,937 A | 5/2000 | Singer et al. | |
| 6,072,355 A | 6/2000 | Bledsoe | |
| 6,094,088 A * | 7/2000 | Yano | 327/534 |
| 6,215,348 B1 | 4/2001 | Steensgaard-Madsen | |
| 6,265,911 B1 | 7/2001 | Nairn | |
| 6,310,515 B1 | 10/2001 | Moldsvor | |
| 6,310,565 B1 | 10/2001 | Ong et al. | |
| 6,396,325 B2 * | 5/2002 | Goodell | 327/308 |
| 6,563,447 B1 | 5/2003 | Schofield | |
| 6,677,828 B1 | 1/2004 | Harnett et al. | |
| 6,703,682 B2 | 3/2004 | Aswell | |
| 6,798,629 B1 | 9/2004 | Proebsting | |
| 6,888,409 B1 | 5/2005 | Taylor | |
| 6,897,701 B2 | 5/2005 | Chen et al. | |
| 7,019,580 B1 | 3/2006 | Michalski | |
| 7,049,877 B2 | 5/2006 | Clara et al. | |
| 7,095,266 B2 * | 8/2006 | Miske | 327/427 |
| 7,098,684 B2 | 8/2006 | Devendorf et al. | |
| 7,098,755 B2 | 8/2006 | Zhao et al. | |
| 7,176,742 B2 | 2/2007 | Aksin et al. | |
| 7,236,044 B2 | 6/2007 | Talwalkar et al. | |

(Continued)

FOREIGN PATENT DOCUMENTS

WO   WO-2007097925   8/2007

OTHER PUBLICATIONS

Kang, et al. Linearity analysis of CMOS for RF application.

(Continued)

*Primary Examiner* — Lincoln Donovan
*Assistant Examiner* — Patrick O'Neill
(74) *Attorney, Agent, or Firm* — Knobbe Martens Olson & Bear LLP

(57) ABSTRACT

A dynamically self-bootstrapping circuit for a switch features a resistor in series with the control node of the switch. A bypass switch connects a control node to ground. When the switch is in an off-state, the bypass switch is enabled.

20 Claims, 9 Drawing Sheets

U.S. PATENT DOCUMENTS

| | | |
|---|---|---|
| 7,253,675 B2 | 8/2007 | Aksin et al. |
| 7,274,242 B2 | 9/2007 | Farjad-rad |
| 7,279,940 B1 | 10/2007 | Min |
| 7,301,398 B1 | 11/2007 | Allott et al. |
| 7,659,770 B2 * | 2/2010 | Teraguchi et al. ............ 327/534 |
| 2004/0196089 A1 | 10/2004 | O'Donnell et al. |
| 2007/0046359 A1 | 3/2007 | Zanchi et al. |
| 2007/0072576 A1 | 3/2007 | Sjoland et al. |
| 2007/0097925 A1 | 5/2007 | Morgan et al. |
| 2009/0102542 A1 * | 4/2009 | Reynolds ...................... 327/478 |

OTHER PUBLICATIONS

Liessner et al., Improving FET Switch Linearity.
Torres, et al. Monolithic transistors SPST switch for L band.

* cited by examiner

METHOD AND APPARATUS FOR A DYNAMICALLY SELF-BOOTSTRAPPED SWITCH

TECHNICAL FIELD

The present invention relates, in various embodiments, to switches and systems and methods of dynamically self-bootstrapping the same.

BACKGROUND

Switches, such as field-effect transistor ("FET") or microelectro-mechanical system ("MEMS") switches, are used extensively in analog, mixed-signal, and radio-frequency ("RF") applications. RF applications may use switches for signal routing (e.g., as transmit/receive switches), as switched attenuators, switched resonators, switched capacitors, or as capacitor band-switched voltage-controlled oscillators ("VCO"). A switch may also be used as, for example, a mixer.

One example of a FET switch is an n-type metal-oxide-semiconductor ("NMOS") transistor pass-gate, wherein the input signal is received at the transistor's source, the output is generated by the transistor's drain, and the gate and back gate of the transistor control the state of the switch.

This FET switch may exhibit poor performance at high frequencies, such as RF frequencies. The NMOS transistor may be sized such that its on-resistance ("$R_{on}$") provides a low-resistance signal path from the switch's input to its output. At this size, however, the transistor may have large parasitic capacitances connecting the source and drain to the transistor's gate and back gate. At high frequencies, the gate and back gate may have low impedances, and the parasitic capacitors may short the switch's input signal to these low impedance nodes and thereby limit the bandwidth of the switch. Furthermore, a varying signal applied to the transistor's input may modulate the conductance ($G_{ds}$) of the transistor, which may produce intermodulation distortion ("IMD") and reduce the linearity of the switch. A similar effect may be observed with any switch that capacitively links an input signal to a control node, such as a MEMS switch.

Resistors may be added in series with the control node(s) to mitigate these problems. The resistors may limit the effects of the parasitic capacitances by raising the impedances of the control node(s), which may prevent the input signal from shorting to the control node(s), thereby reducing signal loss and improving the bandwidth of the switch. In addition, by raising the impedance of the control node(s), the resistors may "free" the control node(s) to track changes in the input voltage applied to the transistor's source—a method of self-bootstrapping. For example, as the FET switch's gate-source voltage ("$V_{gs}$") changes in response the input voltage, the resultant reduction in $G_{ds}$ variation may reduce IMD.

These resistors, however, provide a means for the switch's input to couple capacitively to the switch's output, even when the switch is in an off-state. Thus, while the resistors may reduce the on-state loss of the switch, they also undesirably affect the off-state isolation of the switch. A need exists to obtain the benefits of series-connected control node resistors without their drawbacks.

SUMMARY OF THE INVENTION

A circuit in accordance with one embodiment of the present invention connects resistors in series with the control node(s) of a switch, and, by placing bypass switches in parallel with the resistors, may selectively short out the resistors from the circuit. This system and method of dynamic self-bootstrapping disables the bypass switches when the switch is in an on-state, allowing the resistors to self-bootstrap the switch, and enables the bypass switches when the switch is in an off-state. The bypass switches thereby reduce or eliminate the coupling of the voltage at the input of the switch to the control node(s) when the switch is in an off-state. The circuit therefore reduces signal loss and improves the signal bandwidth and linearity of the switch, while also maintaining the off-state isolation of the switch.

In general, in a first aspect, a dynamically self-bootstrapping circuit for a switch includes a first resistor connecting a control node of the switch to a switch control input. A first bypass switch connects the control node of the FET switch to ground. The first bypass switch is disabled when the switch is in an on-state and enabled when it is in an off-state. An input signal for the first bypass switch may be derived from the switch control input.

The switch may be a MEMS switch. In an alternative embodiment, the switch may be a FET switch, and the control node may be a gate node of the FET switch. A second resistor and a second bypass switch may connect a back gate node of the switch to ground. The second bypass switch, like the first, may be disabled when the switch is in an on-state and enabled when it is in an off-state.

The FET switch may be a pass-gate switch, such as an NMOS transistor, a PMOS transistor, or an NMOS transistor in parallel with a PMOS transistor. The FET switch may include a plurality of cascaded transistors. In another embodiment, resistors in series with the gate and back-gate nodes of the bypass switches may self-bootstrap the bypass switches.

In still another embodiment, the FET switch is an RF switch, such as a transmit/receive switch, a switched attenuator, a multipole/multithrow (MPMT) switch, or a capacitor band-switched VCO. The FET switch may be built in a P-doped well within an N-doped well, and the N-doped well is formed on a P-doped substrate. A first reverse-biased diode may be formed between the P-doped well and the N-doped well, and a second reverse-biased diode may be formed between the N-doped well and the P-doped substrate.

In general, in a second aspect, a method of dynamically self-bootstrapping a switch includes connecting a first resistor between a control node of the switch and a switch control input. A voltage on the control node is allowed to track an input signal voltage when the switch is in an on-state. The voltage on the control node is prevented from tracking the input signal voltage when the switch is in an off-state by bypassing the first resistor with a first bypass switch.

The switch may be a MEMS switch. In an alternative embodiment, the switch may be a FET switch, and the control node may be a gate node of the FET switch. A second resistor and a second bypass switch may connect a back gate node of the switch to ground. The second bypass switch, like the first, may be disabled when the switch is in an on-state and enabled when it is in an off-state.

The FET switch may be a pass-gate switch, such as an NMOS transistor, a PMOS transistor, or an NMOS transistor in parallel with a PMOS transistor. The FET switch may include a plurality of cascaded transistors. In another embodiment, resistors in series with the gate and back-gate nodes of the bypass switches may self-bootstrap the bypass switches.

In still another embodiment, the FET switch is an RF switch, such as a transmit/receive switch, a switched attenuator, a multipole/multithrow (MPMT) switch, or a capacitor band-switched VCO. The FET switch may be built in a P-doped well within an N-doped well, and the N-doped well is formed on a P-doped substrate. A first reverse-biased diode may be formed between the P-doped well and the N-doped well, and a second reverse-biased diode may be formed between the N-doped well and the P-doped substrate.

BRIEF DESCRIPTION OF THE DRAWINGS

The foregoing and other objects, aspects, features, and advantages of the invention will become more apparent and may be better understood by referring to the following description taken in conjunction with the accompanying drawings, in which.

DETAILED DESCRIPTION

In general, the present invention pertains, in various embodiments, to devices, systems, and methods for dynamically self-bootstrapping a switch. To provide an overall understanding of the invention, certain illustrative embodiments are described, including devices, systems, and methods for dynamically self-bootstrapping a MEMS switch and an NMOS pass-gate switch by using control node resistors and bypass switches.

Figure 1A:
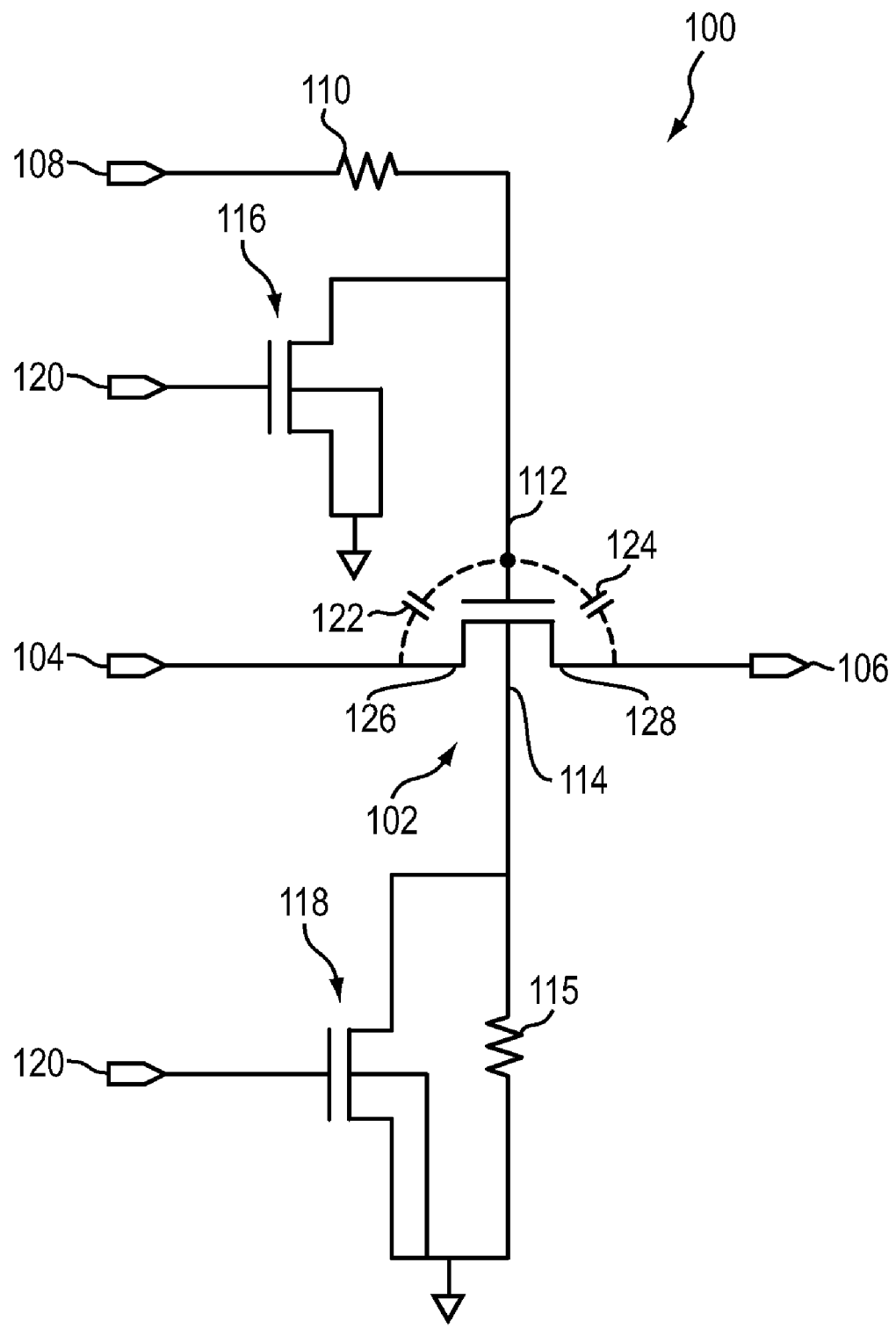
FIG. 1A depicts a dynamically self-bootstrapped FET switch.

FIG. 1A illustrates a circuit 100 in accordance with one embodiment of the present invention. The circuit 100 features an NMOS pass-gate transistor 102 with a signal input 104, an output 106, and a switch control input 108. One of skill in the art will understand that a pass-gate switch is but one possible implementation of a FET switch, and that many other implementations exist. For example, the pass-gate switch may alternatively feature a PMOS transistor, or NMOS and PMOS transistors in parallel. A gate resistor 110 is in series with the gate 112, and a back-gate resistor 115 is in series with the back gate 114. Bypass switches 116, 118 are connected to the gate 112 and back gate 114, respectively, and are controlled by a bypass switch control input 120. In one embodiment, the bypass switches 116, 118 are connected in parallel with the resistors 110, 115. In an alternative embodiment, the bypass switches 116, 118 connect the gate 112 and back gate 114 to low-impedance nodes, such as power or ground. The bypass switch control input 120 may be derived from the switch control input 108 or may be separately generated. In alternative embodiments, the transistor 102 may not have a back-gate connection 114, or the back-gate connection may not be bootstrapped, self-bootstrapped, or dynamically self-bootstrapped.

The circuit 100 may be used in many applications; for example, the circuit 100 may be used as an RF switch. As an RF switch, the circuit 100 may be used as a transmit/receive switch, a switched attenuator, a multipole/multithrow (MPMT) switch, or a capacitor band-switched VCO. In addition, the circuit 100 may be used as, for example, a mixer.

In general, MOS transistors, for example the NMOS transistor 102 of the present circuit 100, may exhibit parasitic capacitances 122, 124 between the source 126 and gate 112 of the transistor and between the gate 112 and drain 128 of the transistor. The parasitic gate-source capacitance 122 may allow a signal applied to the signal input 104 to couple to the gate 112. If the gate 112 is a low-impedance node, the voltage on the gate 112 may not change significantly in response to coupling from the signal input 104, and, furthermore, the gate 112 may short out a portion of the voltage on the signal input 104. Adding the gate resistor 110, however, raises the impedance of the gate 112, prevents shorting to the signal input 104, and "frees" the voltage on the gate 112 to track the voltage on the signal input 104. The back-gate resistor 115 similarly prevents shorting to the back gate 114 and frees the back gate 114 to also track the voltage on the signal input 104.

When the switch 100 is in an on-state, the resistors 110, 115 thus allow the voltage on the signal input 104 to modulate the voltage on the gate 112 and back gate 114, and hence $V_{gs}$, thereby reducing the variation in $G_{ds}$ caused by the varying input signal 104. The reduction in $G_{ds}$ variation may reduce the IMD distortion caused by the transient signal swing on the source 126 of the pass-gate transistor 102. For example, a transient change in the source 126 voltage of the transistor 102, which would ordinarily cause a nonlinear response in the transistor 102, may be offset by the induced change in the voltage on gate 112. The induced change in $V_{gs}$ may bring the device back into linear operation.

When the switch 100 is in an off-state, however, the high-impedance gate 112 and back gate 114 may introduce a deleterious effect. A changing voltage on the signal input 104 may couple to the gate 112 and back gate 114 through the parasitic source-gate capacitance 122, and then to the output 106 through the parasitic gate-drain capacitance 124. The off-state isolation of the switch 100 may therefore suffer. The bypass switches 116, 118 may mitigate this effect by changing the impedance of the gate 112 and back gate 114 while the switch 100 is in an off-state. The bypass switch control input 120 may activate the bypass switches 116, 118 when the switch 100 is in an off-state. The bypass switches 116, 118 may then provide a low-impedance path between the gate 112 and back gate 114 and ground, effectively removing the resistors 110, 115 from the circuit. The low-impedance gate 112 and back gate 114 may therefore prevent a voltage on the signal input 104 from coupling to the output 106.

Figure 1B:
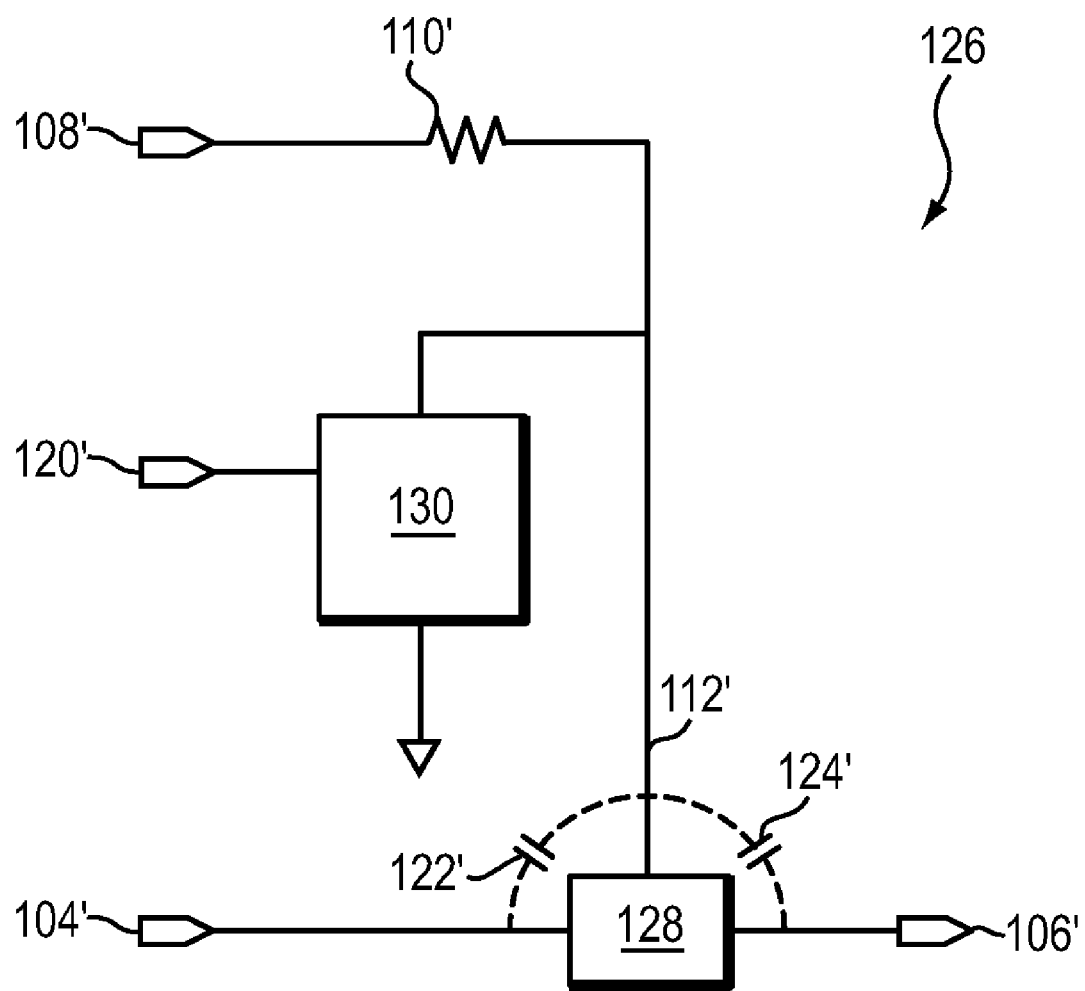
FIG. 1B depicts a dynamically self-bootstrapped MEMS switch.

FIG. 1B illustrates a circuit 126 in accordance with an alternative embodiment of the present invention. A MEMS switch 128 may be used in a switching application, as discussed above, and may exhibit a first capacitance 122' between a signal node 104' and a control node 112' and a second capacitance 124' between the control node 112' and an output node 106'. The capacitances 122', 124' may be deliberately added to the circuit 126, or may be intrinsic side-effects of aspects of the design of the MEMS switch 128.

A resistor 110' may be connected in series with the control node 112', between it and a switch control input 108'. As described above, the resistor 110' may allow the control node 112' to track changes in the voltage of the signal input 104' while the MEMS switch 128 is in an on-state. The simultaneously changing signal input 104' and control node 112' may thus improve the linearity and bandwidth of the MEMS switch 128 by reducing the variation in the signal-control voltage. When the MEMS switch 128 is off, a bypass switch control input 120' may activate a MEMS bypass switch 130, providing a low-impedance path between the control node 112' and ground. Like the circuit of FIG. 1A, the MEMS bypass switch 130 may prevent the control node 112' from tracking the voltage on the signal node 104' when the switch is in an off-state, thereby preventing the signal node voltage from coupling to the output node 106' through the capacitors 122', 124'.

Figure 2:
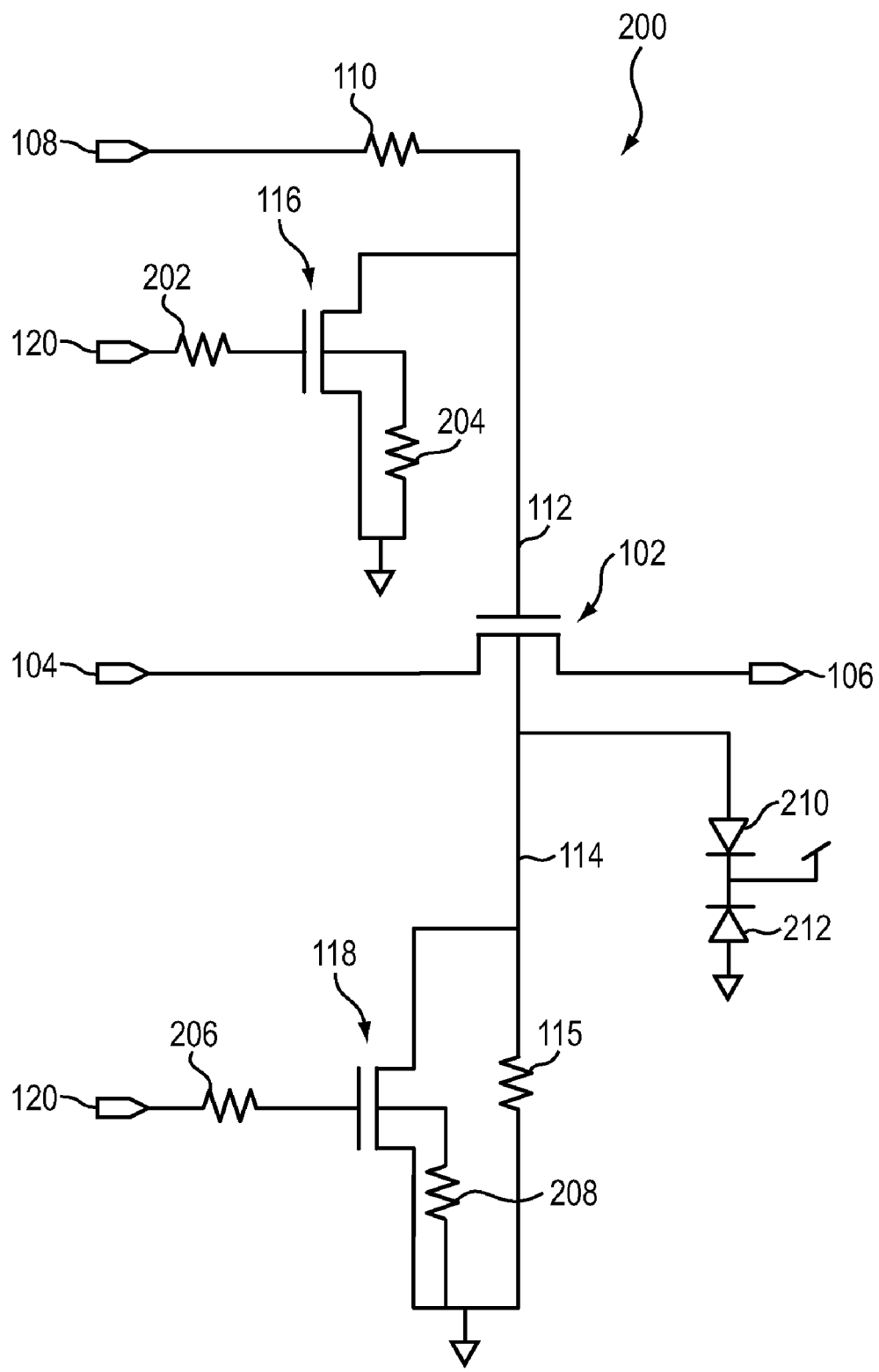
FIG. 2 depicts a dynamically self-bootstrapped FET switch with self-bootstrapped bypass switches.

FIG. 2 illustrates another embodiment 200 of the present invention. In this embodiment, the bypass switches 116, 118 are self-bootstrapped with resistors 202, 206 in series with their gates and resistors 204, 208 in series with their back gates. The bypass switch resistors 202, 204, 206, 208 may modulate the $G_{ds}$ of the bypass switches 116, 118 and improve their bandwidth and linearity, just as the resistors 110, 115 do for the transistor 102, as described above.

The switch 200 may be formed inside of a substrate well in order to isolate the switch 200 from, for example, electrical noise from nearby circuits. In one embodiment, the switch 200 may be formed inside a P-doped well. In another embodiment, the P-doped well may itself be formed inside an N-doped well. Both wells may be formed on a P-doped substrate. In an alternative embodiment, the switch 200 features PMOS transistors and is formed inside a N-doped well.

The substrate wells surrounding the switch 200 may form PN junction diodes. In one embodiment, a diode 210 may be formed from a P-doped well inside an N-doped well. A second diode 212 may be formed from the N-doped well and the P-doped substrate. Both diodes 210, 212 may be reversed-biased to prevent current flow through them.

Figure 3:
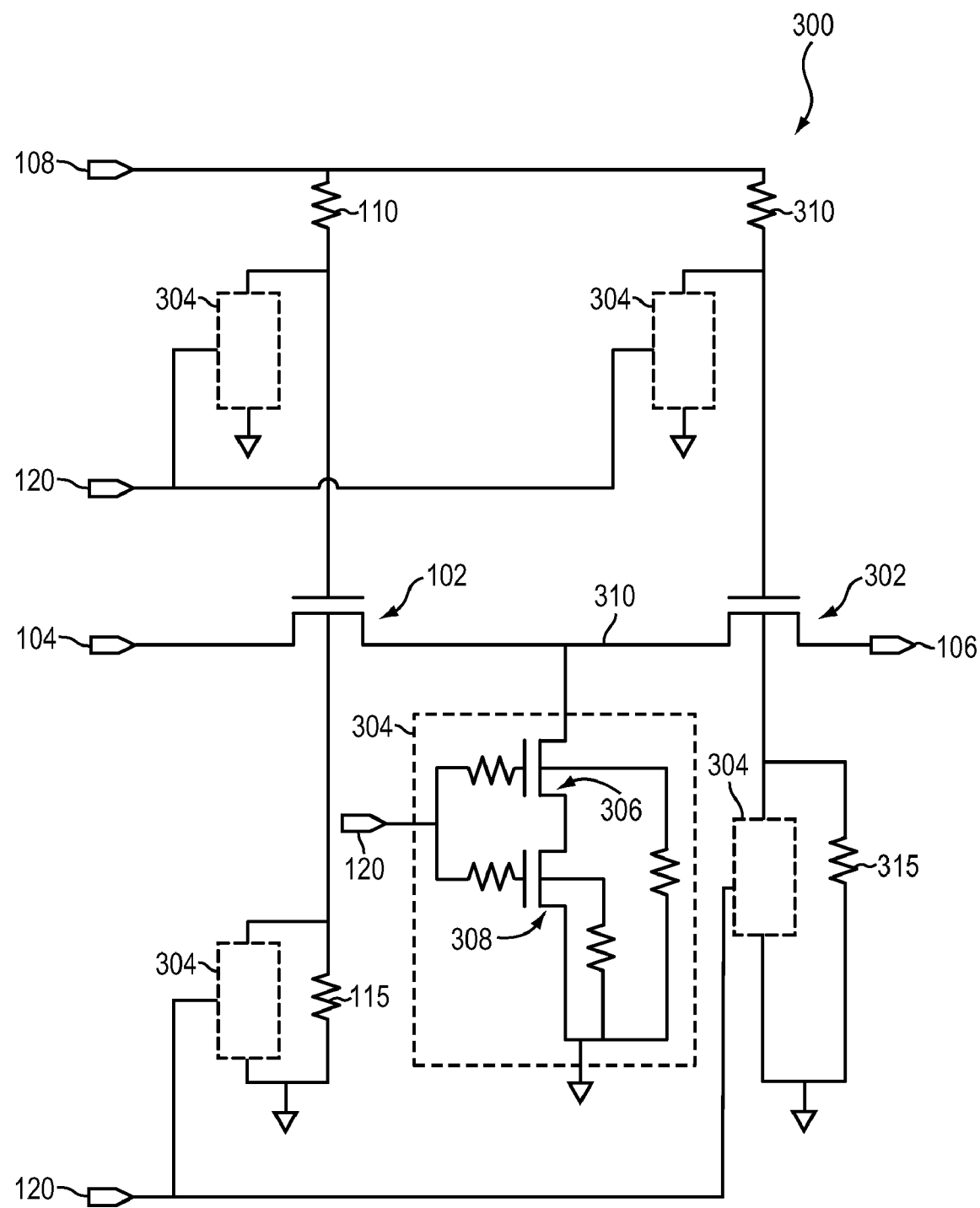
FIG. 3 depicts a dynamically self-bootstrapped FET switches with cascaded transistors.

FIG. 3 illustrates a third embodiment 300 of the present invention. In this embodiment, a second pass-gate transistor 302 has been cascaded with the first pass-gate transistor 102. This cascade configuration may be used in high-power applications, where a large difference between the voltages at the signal input 104 and output 106 may induce breakdown effects in a single switch transistor. By cascading the transistors 102, 302, the voltage differential may be shared across both transistors, thereby halving the voltage across a single transistor. In alternative embodiments, three or more transistors may be cascaded together. Each cascaded transistor 102, 302 may be self-bootstrapped with gate resistors 110, 310 and back-gate resistors 115, 315.

The transistors 306, 308 in bypass switch 304 may also be cascaded together to protect them from high voltages, and may also be self-bootstrapped with resistors. In one embodiment, the bypass switch 304 may be placed at node 310 to provide a low-impedance path between node 310 and ground while the switch 300 is in an off-state. The bypass switch 304 may also be used to bypass the resistors 110, 115 of transistor 102 and/or the resistors 310, 315 of transistor 302.

Figure 4:
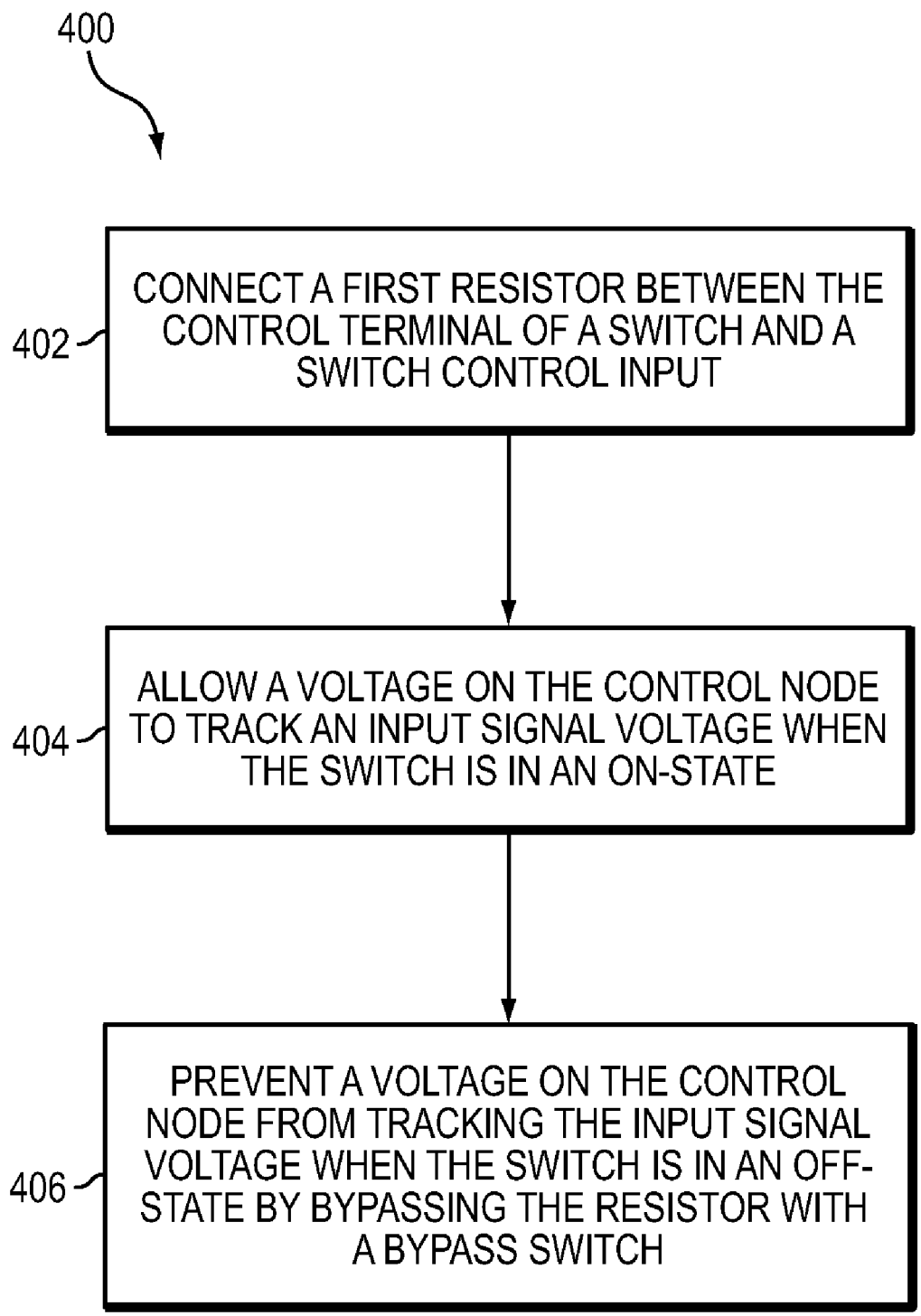
FIG. 4 is a flow chart depicting a method of dynamically self-bootstrapping in accordance with one embodiment of the invention.

FIG. 4 is a flow chart of a process for dynamically self-bootstrapping a switch in accordance with one embodiment of the invention. In the first step 402, a resistor is connected between the control node of a switch and a switch control input. A voltage on the control node is allowed to track an signal input voltage when the switch is in an on-state in the second step 404. Finally, in the last step 406, the voltage on the control node is prevented from tracking the signal input voltage when the switch is in an off-state by bypassing the resistor with a bypass switch.

Figure 5:
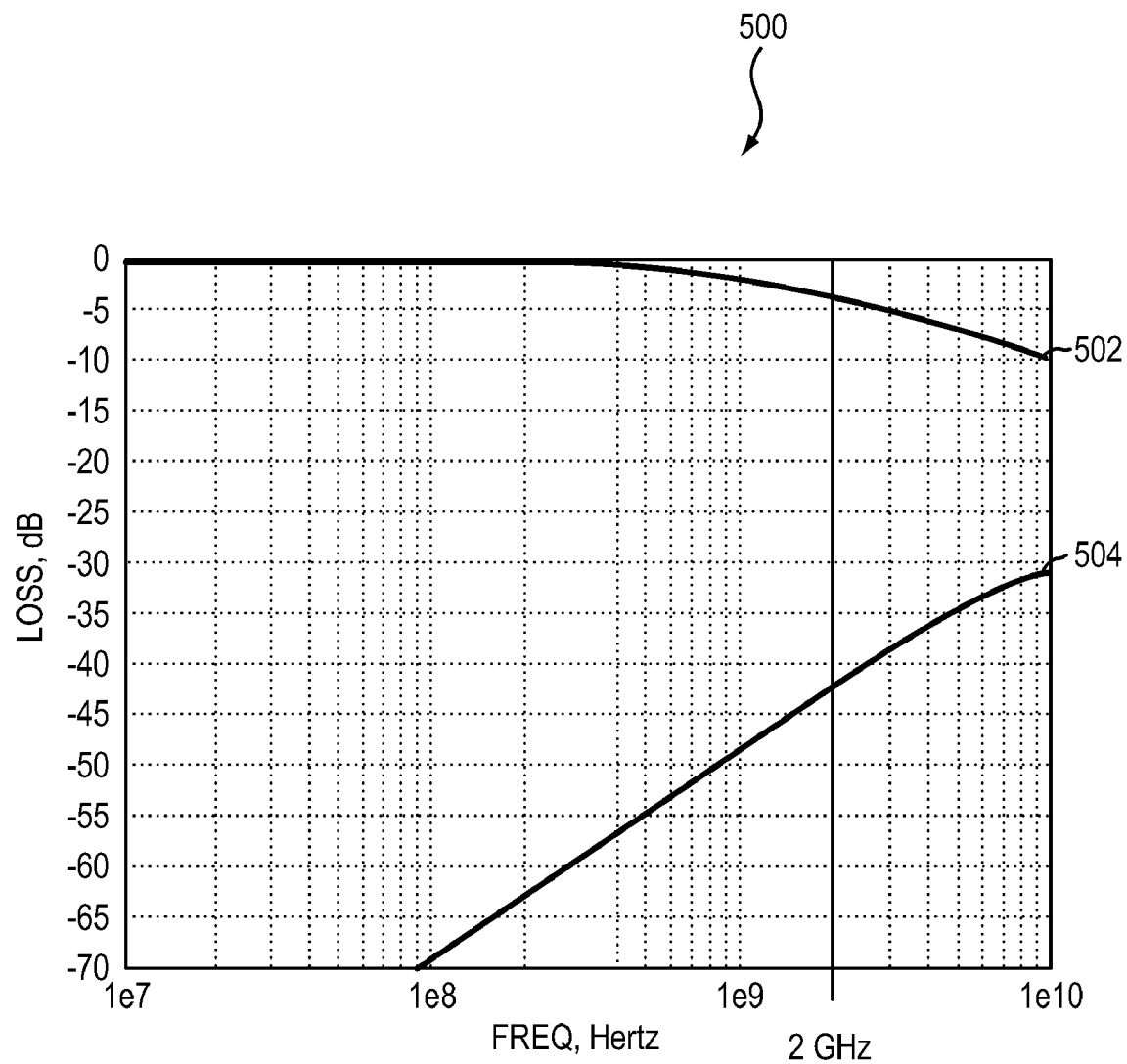
FIG. 5 depicts the on-state loss and off-state isolation of a non-bootstrapped FET switch.

FIGS. 5-8 plot on-state loss and off-state isolation versus frequency for various embodiments of the present invention. FIG. 5 shows a graph 500 that plots the characteristics of a FET switch that has neither self-bootstrapping resistors nor bypass switches. A first curve 502 shows the on-state loss of the switch, and a second curve 504 shows the off-state isolation of the switch. At 2 GHz, the loss may be approximately −1.4 dB and the off-state isolation may be approximately −42 dB.

Figure 6:
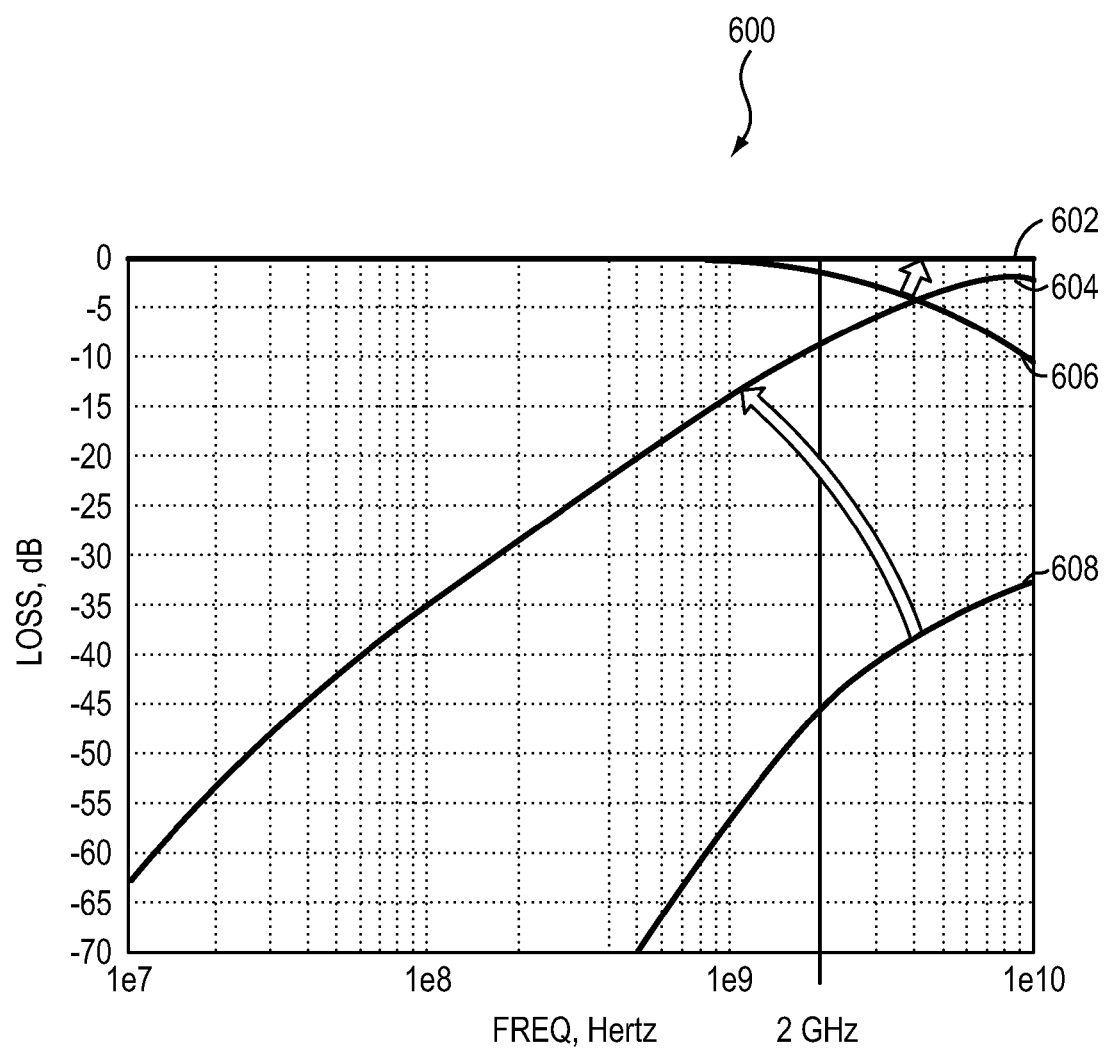
FIG. 6 depicts the on-state loss and off-state isolation of a self-bootstrapped FET switch.

FIG. 6 shows the effect of adding self-bootstrapping resistors to a FET switch. The resistors may improve the on-state loss of a non-bootstrapped circuit, shown by a first curve 606, to a second curve 602 that represents the on-state loss of a self-bootstrapped circuit. At 2 GHz, the on-state loss may improve from approximately −1.4 dB to approximately −0.2 dB. As explained above, however, this boost in on-state loss may come at the expense of off-state isolation, as reflected in the lower curves 604, 608. The off-state isolation 608 of a non-bootstrapped circuit may fall, as reflected in the curve 604 representing the off-state isolation of a self-bootstrapped circuit. At 2 GHz, the off-state isolation may fall from approximately −46 dB to approximately −9 dB.

Figure 7:
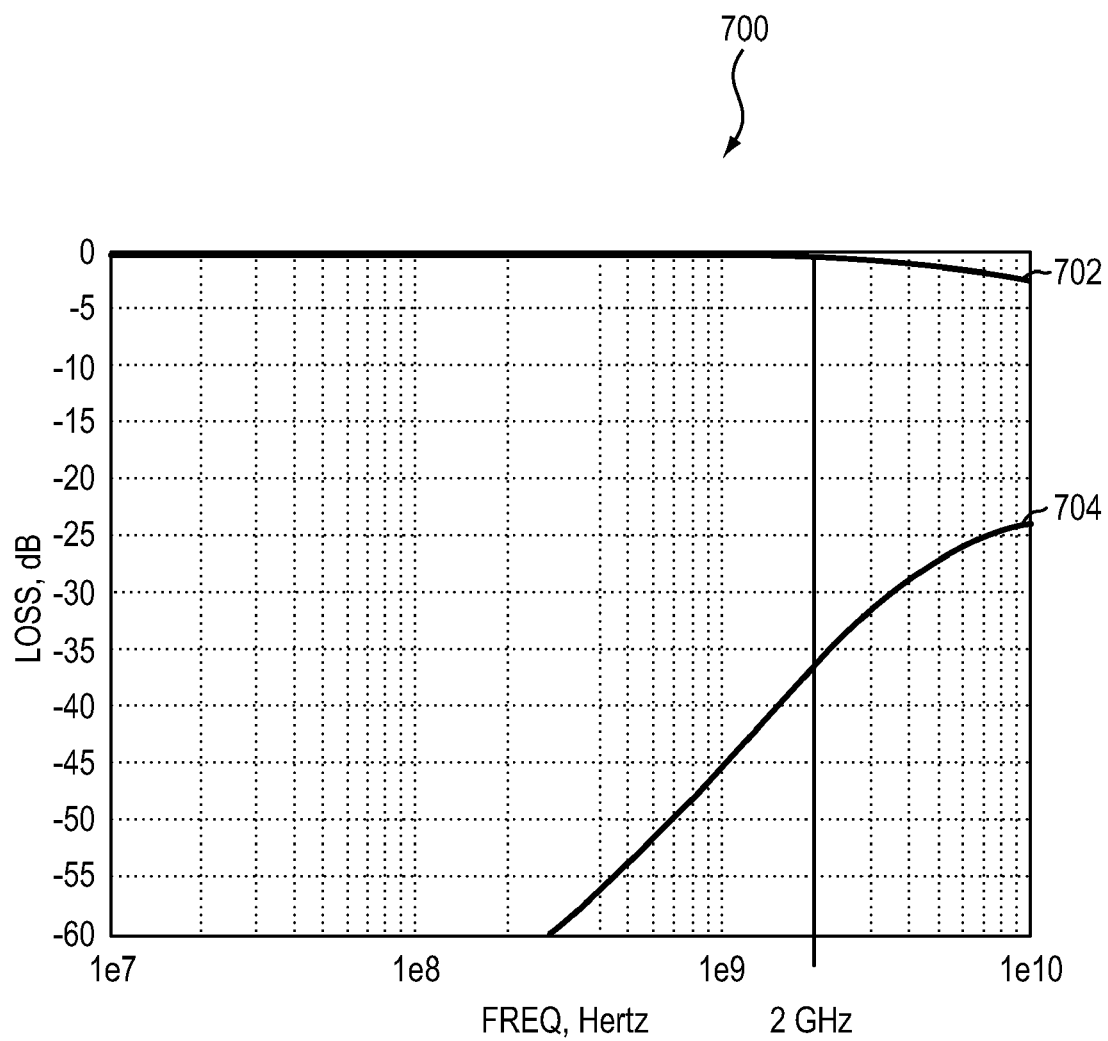
FIG. 7 depicts the on-state loss and off-state isolation of a dynamically self-bootstrapped FET switch.

FIG. 7 shows the on-state loss 702 and off-state isolation 704 of a FET switch employing self-bootstrapping resistors and bypass switches, such as, for example, the switch 100 of FIG. 1A. The on-state loss at 2 GHz is approximately −0.3 dB, but the addition of the bypass switches may improve the off-state rejection at 2 GHz to approximately −37 dB.

Figure 8:
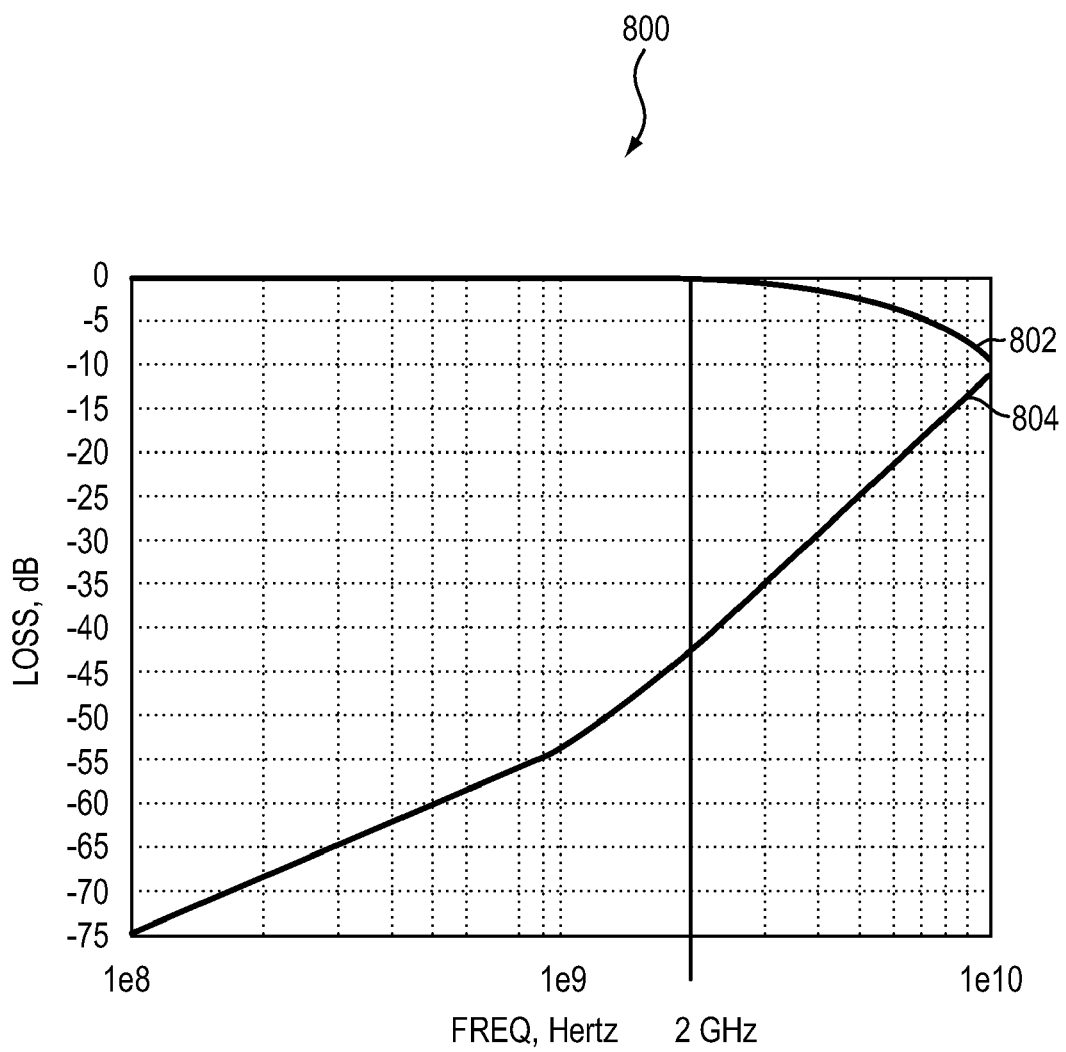
FIG. 8 depicts the on-state loss and off-state isolation of a dynamically self-bootstrapped FET switch with self-bootstrapped bypass switches.

FIG. 8 shows the on-state loss 802 and off-state rejection 804 of a FET switch with self-bootstrapping resistors and self-bootstrapped bypass switches, such as, for example, the FET switch 200 shown in FIG. 2. At 2 GHZ, the on-state loss is approximately −0.6 dB, and the off-state rejection improves further to approximately 42 dB.

It will therefore be seen that the foregoing represents a highly advantageous approach to a self-bootstrapped FET switch. The terms and expressions employed herein are used as terms of description and not of limitation and there is no intention, in the use of such terms and expressions, of excluding any equivalents of the features shown and described or portions thereof, but it is recognized that various modifications are possible within the scope of the invention claimed.

What is claimed is:

1. A dynamically self-bootstrapping circuit for a switch comprising:
    a first resistor connecting a control node of the switch to a switch control input;
    a first bypass switch connecting the control node of the switch to ground;
    a first bypass switch resistor in series with a gate node of the first bypass switch; and
    a second bypass switch resistor in series with a back gate node of the first bypass switch, the first and second bypass switch resistors self-bootstrapping the first bypass switch,
    wherein the first bypass switch is disabled when the switch is in an on-state and enabled when the switch is in an off-state.

2. The circuit of claim 1, wherein the switch is an FET switch and the control node is a gate node of the FET switch.

3. The circuit of claim 2, further comprising:
    a second resistor connecting a back gate node of the FET switch to ground; and
    a second bypass switch connecting the back gate node of the FET switch to ground,
    wherein the second bypass switch is disabled when the FET switch is in an on-state, and enabled when the FET switch is in an off-state.

4. The circuit of claim 3, further comprising:
    a third bypass switch resistor in series with a gate node of the second bypass switch; and a fourth bypass switch resistor in series with a back gate node of the second bypass switch, the third and fourth bypass switch resistors self-bootstrapping the second bypass switch.

5. The circuit of claim 2, wherein the FET switch is a pass-gate switch.

6. The circuit of claim 5, wherein the pass-gate switch is selected from the group consisting of an NMOS transistor, a PMOS transistor, and an NMOS transistor in parallel with a PMOS transistor.

7. The circuit of claim 2, wherein the FET switch is an RF switch.

8. The circuit of claim 7, wherein the RF switch is selected from the group consisting of a transmit/receive switch, a switched attenuator, multipole/multithrow (MPMT) switches, and a capacitor band-switched VCO.

9. The circuit of claim 1, wherein the switch comprises a plurality of cascaded transistors.

10. The circuit of claim 1, wherein the switch is a MEMS switch.

11. A method of dynamically self-bootstrapping a switch comprising:
  connecting a first resistor between a control node of the switch and a switch control input;
  allowing a voltage on the control node to track an input signal voltage when the switch is in an on-state;
  preventing the voltage on the control node from tracking the input signal voltage when the switch is in an off-state by bypassing the first resistor with a first bypass switch; and
  self-bootstrapping the first bypass switch with a first bypass switch resistor in series with a gate node of the first bypass switch and a second bypass switch resistor in series with a back gate node of the first bypass switch.

12. The method of claim 11, wherein the switch is a FET switch and the control node is a gate node of the FET switch.

13. The method of claim 12, further comprising:
  connecting a second resistor between a back gate node of the FET switch and ground; and
  bypassing the second resistor with a second bypass switch when the FET switch is in an off-state.

14. The method of claim 13, further comprising self-bootstrapping the second bypass switch with a third bypass switch resistor in series with a gate node of the second bypass switch and a fourth bypass switch resistor in series with a back gate node of the second bypass switch.

15. The method of claim 12, wherein the FET switch is a pass-gate switch.

16. The method of claim 15, wherein the pass-gate switch is selected from the group consisting of an NMOS transistor, a PMOS transistor, and an NMOS transistor in parallel with a PMOS transistor.

17. The method of claim 12, wherein the FET switch is an RF switch.

18. The method of claim 17, wherein the RF switch is selected from .the group consisting of a transmit/receive switch, a switched attenuator, multipole/multithrow (MPMT) switches, and a capacitor band-switched VCO.

19. The method of claim 11, wherein the switch comprises a plurality of cascaded transistors.

20. The method of claim 11, wherein the switch is a MEMS switch.

* * * * *